United States Patent
Teofilovic

(10) Patent No.: US 9,049,783 B2
(45) Date of Patent: Jun. 2, 2015

(54) SYSTEMS AND METHODS FOR OBTAINING LARGE CREEPAGE ISOLATION ON PRINTED CIRCUIT BOARDS

(75) Inventor: Dejan Teofilovic, Ann Arbor, MI (US)

(73) Assignee: HISTOSONICS, INC., Ann Arbor, MI (US)

( * ) Notice: Subject to any disclaimer, the term of this patent is extended or adjusted under 35 U.S.C. 154(b) by 324 days.

(21) Appl. No.: 13/446,783

(22) Filed: Apr. 13, 2012

(65) Prior Publication Data

US 2013/0269982 A1 Oct. 17, 2013

(51) Int. Cl.
*G02B 6/26* (2006.01)
*G02B 6/42* (2006.01)
*H05K 1/02* (2006.01)

(52) U.S. Cl.
CPC .... *H05K 1/0256* (2013.01); *H05K 2201/09972* (2013.01); *H05K 2201/10121* (2013.01)

(58) Field of Classification Search
USPC ...................... 385/24, 31, 39, 40–42; 323/902
See application file for complete search history.

(56) References Cited

U.S. PATENT DOCUMENTS

| | | | |
|---|---|---|---|
| 3,243,497 A | 3/1966 | Kendall et al. | |
| 3,679,021 A | 7/1972 | Goldberg | |
| 4,024,501 A | 5/1977 | Herring et al. | |
| 4,051,394 A * | 9/1977 | Tieden | 327/79 |
| 4,117,446 A | 9/1978 | Alais | |
| 4,269,174 A | 5/1981 | Adair | |
| 4,277,367 A | 7/1981 | Madsen et al. | |
| 4,351,038 A | 9/1982 | Alais | |
| 4,406,153 A | 9/1983 | Ophir et al. | |
| 4,440,025 A | 4/1984 | Hayakawa et al. | |
| 4,453,408 A | 6/1984 | Clayman | |
| 4,483,345 A | 11/1984 | Miwa | |

(Continued)

FOREIGN PATENT DOCUMENTS

| | | |
|---|---|---|
| DE | 3220751 A1 | 12/1983 |
| DE | 3544628 A1 | 6/1987 |

(Continued)

OTHER PUBLICATIONS

Bjoerk et al.; Cool/MOS CP—How to make most beneficial use of the generation of super junction technology devices. Infineon Technologies AG. Feb. 2007 [retrieved Feb. 4, 2014] from the internet (http://www.infineon.com/dgdl/Infineon+- +-+Application+ Note+-+PowerMOSFETs+-+600V+CoolMOS%E284%A2+-+CP+ Most+ beneficial+use+of+superjunction+technologie+devices. pdf?folderId=db3a304412b407950112b408e8c90004 &fileId=db3a304412b407950112b40ac9a40688>pp. 1, 4, 14.

(Continued)

*Primary Examiner* — Emily P Pham
(74) *Attorney, Agent, or Firm* — Shay Glenn LLP

(57) ABSTRACT

An electrical circuit with large creepage isolation distances is provided. In some embodiments, the electrical circuit is capable of increasing creepage isolation distances by many multiples over traditional electrical circuits. In one embodiment, an electrical circuit comprises a ground circuit optically coupled to a floating circuit, and an isolated circuit optically coupled to the floating circuit. The circuits can be optically coupled with opto-isolators, for example. The isolated circuit can have a creepage isolation distance at least twice as large as a traditional circuit. In some embodiments, "n" number of floating circuits can be optically coupled between the ground circuit and the isolated circuit to increase the total creepage isolation distance by a factor of "n". Methods of use are also described.

24 Claims, 5 Drawing Sheets

(56) References Cited

U.S. PATENT DOCUMENTS

| | | | |
|---|---|---|---|
| 4,549,533 A | 10/1985 | Cain et al. | |
| 4,550,606 A | 11/1985 | Drost | |
| 4,575,330 A | 3/1986 | Hull | |
| 4,622,972 A | 11/1986 | Giebeler, Jr. | |
| 4,625,731 A | 12/1986 | Quedens et al. | |
| 4,641,378 A | 2/1987 | McConnell et al. | |
| 4,669,483 A | 6/1987 | Hepp et al. | |
| 4,689,986 A | 9/1987 | Carson et al. | |
| 4,757,820 A | 7/1988 | Itoh | |
| 4,791,915 A | 12/1988 | Barsotti et al. | |
| 4,819,621 A | 4/1989 | Ueberle et al. | |
| 4,829,491 A | 5/1989 | Saugeon et al. | |
| 4,856,107 A | 8/1989 | Dory | |
| 4,865,042 A | 9/1989 | Umemura et al. | |
| 4,888,746 A | 12/1989 | Wurster et al. | |
| 4,890,267 A | 12/1989 | Rudolph | |
| 4,922,917 A | 5/1990 | Dory | |
| 4,938,217 A | 7/1990 | Lele | |
| 4,957,099 A | 9/1990 | Hassler | |
| 4,973,980 A | 11/1990 | Howkins et al. | |
| 4,984,575 A | 1/1991 | Uchiyama et al. | |
| 4,991,151 A | 2/1991 | Dory | |
| 4,995,012 A | 2/1991 | Dory | |
| RE33,590 E | 5/1991 | Dory | |
| 5,014,686 A | 5/1991 | Schafer | |
| 5,065,751 A | 11/1991 | Wolf | |
| 5,080,101 A | 1/1992 | Dory | |
| 5,080,102 A | 1/1992 | Dory | |
| 5,091,893 A | 2/1992 | Smith et al. | |
| 5,092,336 A | 3/1992 | Fink | |
| 5,097,709 A | 3/1992 | Masuzawa et al. | |
| 5,111,822 A | 5/1992 | Dory | |
| 5,143,073 A | 9/1992 | Dory | |
| 5,143,074 A | 9/1992 | Dory | |
| 5,150,711 A | 9/1992 | Dory | |
| 5,158,070 A | 10/1992 | Dory | |
| 5,158,071 A | 10/1992 | Umemura et al. | |
| 5,163,421 A | 11/1992 | Bernstein et al. | |
| 5,209,221 A | 5/1993 | Riedlinger | |
| 5,215,680 A | 6/1993 | D'Arrigo | |
| 5,219,401 A | 6/1993 | Cathignol et al. | |
| 5,230,340 A | 7/1993 | Rhyne | |
| 5,295,484 A | 3/1994 | Marcus et al. | |
| 5,316,000 A | 5/1994 | Chapelon et al. | |
| 5,354,258 A | 10/1994 | Dory | |
| 5,380,411 A | 1/1995 | Schlief | |
| 5,409,002 A | 4/1995 | Pell | |
| 5,431,621 A | 7/1995 | Dory | |
| 5,435,311 A | 7/1995 | Umemura et al. | |
| 5,443,069 A | 8/1995 | Schaetzle | |
| 5,469,852 A | 11/1995 | Nakamura et al. | |
| 5,474,071 A | 12/1995 | Chapelon et al. | |
| 5,474,531 A | 12/1995 | Carter | |
| 5,501,655 A | 3/1996 | Rolt et al. | |
| 5,520,188 A | 5/1996 | Hennige et al. | |
| 5,523,058 A | 6/1996 | Umemura et al. | |
| 5,524,620 A | 6/1996 | Rosenschein | |
| 5,540,909 A | 7/1996 | Schutt | |
| 5,542,935 A | 8/1996 | Unger et al. | |
| 5,558,092 A | 9/1996 | Unger et al. | |
| 5,563,346 A | 10/1996 | Bartelt et al. | |
| 5,566,675 A | 10/1996 | Li et al. | |
| 5,573,497 A | 11/1996 | Chapelon | |
| 5,580,575 A | 12/1996 | Unger et al. | |
| 5,582,578 A | 12/1996 | Zhong et al. | |
| 5,590,657 A | 1/1997 | Cain et al. | |
| 5,601,526 A | 2/1997 | Chapelon et al. | |
| 5,617,862 A | 4/1997 | Cole et al. | |
| 5,648,098 A | 7/1997 | Porter | |
| 5,666,954 A | 9/1997 | Chapelon et al. | |
| 5,676,452 A | 10/1997 | Scholz | |
| 5,676,692 A | 10/1997 | Sanghvi et al. | |
| 5,678,554 A | 10/1997 | Hossack et al. | |
| 5,694,936 A | 12/1997 | Fujimoto et al. | |
| 5,695,460 A | 12/1997 | Siegel et al. | |
| 5,717,657 A | 2/1998 | Ruffa | |
| 5,724,972 A | 3/1998 | Petrofsky | |
| 5,743,863 A | 4/1998 | Chapelon | |
| 5,753,929 A * | 5/1998 | Bliss | 250/551 |
| 5,759,162 A | 6/1998 | Oppelt et al. | |
| 5,766,138 A | 6/1998 | Rattner | |
| 5,769,790 A | 6/1998 | Watkins et al. | |
| 5,797,848 A | 8/1998 | Marian et al. | |
| 5,823,962 A | 10/1998 | Schaetzle et al. | |
| 5,827,204 A | 10/1998 | Grandia et al. | |
| 5,836,896 A | 11/1998 | Rosenschein | |
| 5,849,727 A | 12/1998 | Porter et al. | |
| 5,873,902 A | 2/1999 | Sanghvi et al. | |
| 5,879,314 A | 3/1999 | Peterson et al. | |
| 5,932,807 A | 8/1999 | Mallart | |
| 5,947,904 A | 9/1999 | Hossack et al. | |
| 6,001,069 A | 12/1999 | Tachibana et al. | |
| 6,022,309 A | 2/2000 | Celliers et al. | |
| 6,036,667 A | 3/2000 | Manna et al. | |
| 6,088,613 A | 7/2000 | Unger | |
| 6,093,883 A | 7/2000 | Sanghvi et al. | |
| 6,113,558 A | 9/2000 | Rosenschein et al. | |
| 6,126,607 A | 10/2000 | Whitmore, III et al. | |
| 6,128,958 A | 10/2000 | Cain | |
| 6,143,018 A | 11/2000 | Beuthan et al. | |
| 6,176,842 B1 | 1/2001 | Tachibana et al. | |
| 6,308,585 B1 | 10/2001 | Nilsson et al. | |
| 6,308,710 B1 | 10/2001 | Silva | |
| 6,309,355 B1 | 10/2001 | Cain et al. | |
| 6,318,146 B1 | 11/2001 | Madsen et al. | |
| 6,321,109 B2 | 11/2001 | Ben-Haim et al. | |
| 6,338,566 B1 | 1/2002 | Verdier | |
| 6,344,489 B1 | 2/2002 | Spears | |
| 6,391,020 B1 | 5/2002 | Kurtz et al. | |
| 6,413,216 B1 | 7/2002 | Cain et al. | |
| 6,419,648 B1 | 7/2002 | Vitek et al. | |
| 6,470,204 B1 | 10/2002 | Uzgiris et al. | |
| 6,488,639 B1 | 12/2002 | Ribault et al. | |
| 6,490,469 B2 | 12/2002 | Candy | |
| 6,500,141 B1 | 12/2002 | Irion et al. | |
| 6,506,154 B1 | 1/2003 | Ezion et al. | |
| 6,506,171 B1 | 1/2003 | Vitek et al. | |
| 6,508,774 B1 | 1/2003 | Acker et al. | |
| 6,511,428 B1 | 1/2003 | Azuma et al. | |
| 6,511,444 B2 | 1/2003 | Hynynen et al. | |
| 6,522,142 B1 | 2/2003 | Freundlich | |
| 6,524,251 B2 | 2/2003 | Rabiner et al. | |
| 6,543,272 B1 | 4/2003 | Vitek | |
| 6,556,750 B2 * | 4/2003 | Constantino et al. | 385/41 |
| 6,559,644 B2 | 5/2003 | Froundlich et al. | |
| 6,576,220 B2 | 6/2003 | Unger | |
| 6,599,288 B2 | 7/2003 | Maguire et al. | |
| 6,607,498 B2 | 8/2003 | Eshel | |
| 6,612,988 B2 | 9/2003 | Maor et al. | |
| 6,613,004 B1 | 9/2003 | Vitek et al. | |
| 6,613,005 B1 | 9/2003 | Friedman et al. | |
| 6,626,854 B2 | 9/2003 | Friedman et al. | |
| 6,626,855 B1 | 9/2003 | Weng et al. | |
| 6,645,162 B2 | 11/2003 | Friedman et al. | |
| 6,648,839 B2 | 11/2003 | Manna et al. | |
| 6,666,833 B1 | 12/2003 | Friedman et al. | |
| 6,685,640 B1 | 2/2004 | Fry et al. | |
| 6,685,657 B2 | 2/2004 | Jones | |
| 6,705,994 B2 | 3/2004 | Vortman et al. | |
| 6,719,449 B1 | 4/2004 | Laugharn, Jr. et al. | |
| 6,719,694 B2 | 4/2004 | Weng et al. | |
| 6,735,461 B2 | 5/2004 | Vitek et al. | |
| 6,736,814 B2 | 5/2004 | Manna et al. | |
| 6,750,463 B1 * | 6/2004 | Riley | 250/551 |
| 6,770,031 B2 | 8/2004 | Hynynen et al. | |
| 6,775,438 B1 * | 8/2004 | Gaedke et al. | 385/42 |
| 6,788,977 B2 | 9/2004 | Fenn et al. | |
| 6,790,180 B2 | 9/2004 | Vitek | |
| 6,820,160 B1 * | 11/2004 | Allman | 710/305 |
| 6,852,082 B2 | 2/2005 | Strickberger et al. | |
| 6,869,439 B2 | 3/2005 | White et al. | |
| 6,890,332 B2 | 5/2005 | Truckai et al. | |
| 6,929,609 B2 | 8/2005 | Asafusa | |
| 7,004,282 B2 | 2/2006 | Manna et al. | |

(56) References Cited

U.S. PATENT DOCUMENTS

| | | | |
|---|---|---|---|
| 7,059,168 B2 | 6/2006 | Hibi et al. | |
| 7,128,711 B2 | 10/2006 | Medan et al. | |
| 7,128,719 B2 | 10/2006 | Rosenberg | |
| 7,175,596 B2 | 2/2007 | Vitek et al. | |
| 7,196,313 B2 * | 3/2007 | Quinones et al. | 250/214.1 |
| 7,223,239 B2 | 5/2007 | Schulze et al. | |
| 7,258,674 B2 | 8/2007 | Cribbs et al. | |
| 7,273,458 B2 | 9/2007 | Prausnitz et al. | |
| 7,273,459 B2 | 9/2007 | Desilets et al. | |
| 7,300,414 B1 | 11/2007 | Holland et al. | |
| 7,311,679 B2 | 12/2007 | Desilets et al. | |
| 7,331,951 B2 | 2/2008 | Eshel et al. | |
| 7,341,569 B2 | 3/2008 | Soltani et al. | |
| 7,347,855 B2 | 3/2008 | Eshel et al. | |
| 7,358,226 B2 | 4/2008 | Dayton et al. | |
| 7,359,640 B2 * | 4/2008 | Onde et al. | 398/135 |
| 7,367,948 B2 | 5/2008 | O'Donnell et al. | |
| 7,374,551 B2 | 5/2008 | Liang et al. | |
| 7,377,900 B2 | 5/2008 | Vitek et al. | |
| 7,442,168 B2 | 10/2008 | Novak et al. | |
| 7,462,488 B2 | 12/2008 | Madsen et al. | |
| 7,559,905 B2 | 7/2009 | Kagosaki et al. | |
| 7,656,638 B2 | 2/2010 | Laakso et al. | |
| 8,057,408 B2 | 11/2011 | Cain et al. | |
| 2001/0039420 A1 | 11/2001 | Burbank et al. | |
| 2001/0041163 A1 | 11/2001 | Sugita et al. | |
| 2002/0045890 A1 | 4/2002 | Celliers et al. | |
| 2002/0078964 A1 | 6/2002 | Kovac et al. | |
| 2002/0099356 A1 | 7/2002 | Unger et al. | |
| 2003/0092982 A1 | 5/2003 | Eppstein | |
| 2003/0112922 A1 | 6/2003 | Burdette et al. | |
| 2003/0149352 A1 | 8/2003 | Liang et al. | |
| 2003/0157025 A1 | 8/2003 | Unger et al. | |
| 2003/0181833 A1 | 9/2003 | Faragalla et al. | |
| 2003/0199857 A1 | 10/2003 | Eizenhofer | |
| 2003/0221561 A1 | 12/2003 | Milo | |
| 2004/0127815 A1 | 7/2004 | Marchitto et al. | |
| 2004/0138563 A1 | 7/2004 | Moehring et al. | |
| 2004/0236248 A1 | 11/2004 | Svedman | |
| 2004/0243021 A1 | 12/2004 | Murphy et al. | |
| 2005/0038339 A1 | 2/2005 | Chauhan et al. | |
| 2005/0038361 A1 | 2/2005 | Zhong et al. | |
| 2005/0152561 A1 | 7/2005 | Spencer | |
| 2005/0154314 A1 | 7/2005 | Quistgaard | |
| 2005/0283098 A1 | 12/2005 | Conston et al. | |
| 2006/0060991 A1 | 3/2006 | Holsteyns et al. | |
| 2006/0074303 A1 | 4/2006 | Chornenky et al. | |
| 2006/0206028 A1 | 9/2006 | Lee et al. | |
| 2006/0241466 A1 | 10/2006 | Ottoboni et al. | |
| 2006/0241523 A1 | 10/2006 | Sinelnikov et al. | |
| 2006/0264760 A1 | 11/2006 | Liu et al. | |
| 2006/0293630 A1 | 12/2006 | Manna et al. | |
| 2007/0010805 A1 | 1/2007 | Fedewa et al. | |
| 2007/0016039 A1 | 1/2007 | Vortman et al. | |
| 2007/0065420 A1 | 3/2007 | Johnson | |
| 2007/0083120 A1 | 4/2007 | Cain et al. | |
| 2007/0161902 A1 | 7/2007 | Dan | |
| 2007/0167764 A1 | 7/2007 | Hynynen | |
| 2007/0205785 A1 | 9/2007 | Nilsson | |
| 2007/0219448 A1 | 9/2007 | Seip et al. | |
| 2008/0013593 A1 | 1/2008 | Kawabata | |
| 2008/0055003 A1 | 3/2008 | Unnikrishnan et al. | |
| 2008/0082026 A1 | 4/2008 | Schmidt et al. | |
| 2008/0126665 A1 | 5/2008 | Burr et al. | |
| 2008/0214964 A1 | 9/2008 | Chapelon et al. | |
| 2008/0262345 A1 | 10/2008 | Fichtinger et al. | |
| 2008/0262486 A1 | 10/2008 | Zvuloni et al. | |
| 2008/0312561 A1 | 12/2008 | Chauhan | |
| 2009/0030339 A1 | 1/2009 | Cheng et al. | |
| 2009/0112098 A1 | 4/2009 | Vaezy et al. | |
| 2009/0177085 A1 | 7/2009 | Maxwell et al. | |
| 2009/0198094 A1 | 8/2009 | Fenster et al. | |
| 2009/0211587 A1 | 8/2009 | Lawrentschuk | |
| 2009/0227874 A1 | 9/2009 | Suri et al. | |
| 2010/0011845 A1 | 1/2010 | Laugharn et al. | |
| 2010/0069797 A1 | 3/2010 | Cain et al. | |
| 2010/0125225 A1 | 5/2010 | Gelbart et al. | |
| 2010/0163694 A1 | 7/2010 | Fadler et al. | |
| 2010/0261994 A1 | 10/2010 | Davalos et al. | |
| 2010/0286519 A1 | 11/2010 | Lee et al. | |
| 2010/0317971 A1 | 12/2010 | Fan et al. | |
| 2011/0040190 A1 | 2/2011 | Jahnke et al. | |
| 2011/0054315 A1 | 3/2011 | Hall et al. | |
| 2011/0054363 A1 | 3/2011 | Cain et al. | |
| 2011/0067624 A1 | 3/2011 | Cain et al. | |
| 2011/0112400 A1 | 5/2011 | Emery et al. | |
| 2011/0118602 A1 | 5/2011 | Weng et al. | |
| 2011/0172529 A1 | 7/2011 | Gertner | |
| 2011/0178444 A1 | 7/2011 | Slayton et al. | |
| 2011/0251528 A1 | 10/2011 | Canney et al. | |
| 2012/0010541 A1 | 1/2012 | Cain et al. | |
| 2012/0029353 A1 | 2/2012 | Slayton et al. | |
| 2012/0092724 A1 | 4/2012 | Pettis | |
| 2012/0130288 A1 | 5/2012 | Holland et al. | |
| 2012/0189998 A1 | 7/2012 | Kruecker et al. | |
| 2012/0259250 A1 | 10/2012 | Sapozhnikov et al. | |
| 2012/0271167 A1 | 10/2012 | Holland et al. | |
| 2013/0053691 A1 | 2/2013 | Kawabata et al. | |

FOREIGN PATENT DOCUMENTS

| | | |
|---|---|---|
| DE | 3817094 A1 | 11/1989 |
| EP | 0017382 A1 | 10/1980 |
| EP | 0320303 A2 | 6/1989 |
| EP | 0332871 A2 | 9/1989 |
| EP | 0384831 A2 | 8/1990 |
| EP | 0755653 A1 | 1/1997 |
| EP | 1504713 A1 | 2/2005 |
| GB | 2099582 A | 12/1982 |
| JP | 60-80779 A | 5/1985 |
| JP | 61-196718 A | 8/1986 |
| JP | HEI 2-215451 | 8/1990 |
| JP | HEI 6-197907 A | 7/1994 |
| JP | HEI 7-504339 A | 5/1995 |
| JP | 08-84740 A | 4/1996 |
| JP | 06-304178 A | 5/1996 |
| JP | 08-131454 A | 5/1996 |
| JP | HEI 10-512477 | 12/1998 |
| JP | 2003-510159 A | 3/2003 |
| JP | 2004-505660 A | 2/2004 |
| JP | 2007520307 A | 7/2007 |
| JP | 2010029650 A | 2/2010 |
| JP | 2004-512502 A | 4/2014 |
| WO | WO94/06355 A1 | 3/1994 |
| WO | WO 02/32506 A1 | 4/2002 |
| WO | WO 2008/051484 A2 | 5/2008 |
| WO | WO 2011/092683 A1 | 8/2011 |

OTHER PUBLICATIONS

Therapeutic Ultrasound Group. Non-invasive Ultrasonic Tissue Fraction for Treatment of Benign Disease and Cancer—"Histotripsy". University research [online]. Biomedical Engineering Department, University of Michigan. Jul. 2011[retrieved on Jan. 28, 2014] from: (http://web.archive.org/web/20110720091822/http://www.histotripsy.umich.edu/index.html>.entiredocument).

Aschoff et al.; How does alteration of hepatic blood flow affect liver perfusion and radiofrequency-induced thermal lesion size in rabbit liver?; J Magn Reson Imaging; 13(1); pp. 57-63; Jan. 2001.

Clasen et al.; MR-guided radiofrequency ablation of hepatocellular carcinoma: Long-term effectiveness; J Vasc Intery Radiol; 22(6); pp. 762-770; Jun. 2011.

Cline et al.; Magnetic resonance-guided thermal surgery; Magnetic Resonance in Medicine; 30(1); pp. 98-106; Jul. 1993.

Curiel et al.; Elastography for the follow-up of high-intensity focused ultrasound prostate cancer treatment: Initial comparison with MRI; Ultrasound Med. Biol; 31(11); pp. 1461-1468; Nov. 2005.

Emelianov et al.; Triplex ultrasound: Elasticity imaging to age deep venous thrombosis; Ultrasound Med Biol; 28(6); pp. 757-767; Jun. 2002.

(56) References Cited

OTHER PUBLICATIONS

Hynynen et al.; Tissue thermometry during ultrasound exposure; European Urology; 23(Suppl 1); pp. 12-16; 1993 (year of pub. sufficiently earlier than effective US filing date and any foreign priority date).

Kallel et al.; The feasibility of elastographic visualization of HIFU-induced thermal lesions in soft tissues: Image-guided high-intensity focused ultrasound; Ultrasound Med. Biol; 25(4); pp. 641-647; May 1999.

Konofagou; Quo vadis elasticity imaging?; Ultrasonics; 42(1-9); pp. 331-336; Apr. 2004.

Kruse et al.; Tissue characterization using magnetic resonance elastography: Preliminary results; Phys. Med. Biol; 45(6); pp. 1579-1590; Jun. 2000.

Liu et al.; Real-time 2-D temperature imaging using ultrasound; IEEE Trans Biomed Eng; 57(1); pp. 12-16; Jan. 2010 (author manuscript, 16 pgs.).

Liu et al.; Viscoelastic property measurement in thin tissue constructs using ultrasound; IEEE Trans Ultrason Ferroelectr Freq Control; 55(2); pp. 368-383; Feb. 2008 (author manuscript, 37 pgs.).

Nightingale et al.; Analysis of contrast in images generated with transient acoustic radiation force; Ultrasound Med Biol; 32(1); pp. 61-72; Jan. 2006.

Okada et al.; A case of hepatocellular carcinoma treated by MR-guided focused ultrasound ablation with respiratory gating; Magn Reson Med Sci; 5(3); pp. 167-171; Oct. 2006.

Palmeri et al.; Acoustic radiation force-based elasticity imaging methods; Interface Focus; 1; pp. 553-564; Aug. 2011.

Rowland et al.; MRI study of hepatic tumours following high intensity focused ultrasound surgery; British Journal of Radiology; 70; pp. 144-153; Feb. 1997.

Sapareto et al.; Thermal dose determination in cancer therapy; Int J Radiat Oncol Biol Phys; 10(6); pp. 787-800; Apr. 1984.

Souchon et al.; Visualisation of HIFU lesions using elastography of the human prostate in vivo: Preliminary results; Ultrasound Med. Biol; 29(7); pp. 1007-1015; Jul. 2003.

Xie et al.; Correspondence of ultrasound elasticity imaging to direct mechanical measurement in aging DVT in rats; Ultrasound Med Biol; 31(10); pp. 1351-1359; Oct. 2005 (author manuscript, 20 pgs.).

Zhang et al.; A fast tissue stiffness-dependent elastography for HIFU-induced lesions inspection; Ultrasonics; 51(8); pp. 857-869; Dec. 2011.

Zheng et al.; An acoustic backscatter-based method for localization of lesions induced by high-intensity focused ultrasound; Ultrasound Med Biol; 36(4); pp. 610-622; Apr. 2010.

Xu et al.; U.S. Appl. No. 14/046,024 entitled "Bubble-induced color doppler feedback during histotripsy," filed Oct. 4, 2013.

Hall et al.; Histotripsy of the prostate: dose effects in a chronic canine model; Urology; 74(4); pp. 932-937; Oct. 2009 (author manuscript).

Lake et al.; Histotripsy: minimally invasive technology for prostatic tissue ablation in an in vivo canine model; Urology; 72(3); pp. 682-686; Sep. 2008.

Bertolina et al.; U.S. Appl. No. 13/735,936 entitled "Histotripsy Therapy Transducer," filed Jan. 7, 2013.

Cain, Charles A.; Histotripsy: controlled mechanical sub-division of soft tissues by high intensity pulsed ultrasound (conference presentation); American Institute of Physics (AIP) Therapeutic Ultrasound: 5th International Symposium on Therapeutic Ultrasound; 44 pgs.; Oct. 27-29, 2005.

Hall et al.; Imaging feedback of tissue liquefaction (histotripsy) in ultrasound surgery; IEEE Ultrasonic Symposium, 18-21 Sep. 2005, pp. 1732-1734.

Parsons et al.; Pulsed cavitational ultrasound therapy for controlled tissue homogenization; Ultrasound in Med. & Biol.; vol. 32(1); pp. 115-129; Jan. 2006.

Roberts et al.; Pulsed cavitational ultrasound: a noninvasive technology for controlled tissue ablation (histotripsy) in the rabbit kidney; Journal of Urology; vol. 175(2); pp. 734-738; Feb. 2006.

Xu et al.; A new strategy to enhance cavitational tissue erosion by using a high intensity initiating sequence; IEEE Trans Ultrasonics Ferroelectrics and Freq Control; vol. 53(8); pp. 1412-1424; Aug. 2006.

Xu et al.; Controlled ultrasound tissue erosion: the role of dynamic interaction between insonation and microbubble activity; Journal of the Acoustical Society of America; vol. 117(1); pp. 424-435; Jan. 2005.

Xu et al.; Controlled ultrasound tissue erosion; IEEE Transaction on Ultrasonics, Ferroelectrics, and Frequency Control; vol. 51 (6); pp. 726-736; Jun. 2004.

Xu et al.; Effects of acoustic parameters on bubble cloud dynamics in ultrasound tissue erosion (histotripsy); Journal of the Acoustical Society of America; vol. 122(1); pp. 229-236; Jul. 2007.

Xu et al.; High Speed Imaging of Bubble Clouds Generated in Pulsed Ultrasound Cavitational Therapy'Histotripsy; IEEE Trans Ultrason Ferroelectr Freq Control; ; vol. 54; No. 10; pp. 2091R2101; Oct. 2007.

Xu et al.; Investigation of intensity threshold for ultrasound tissue erosion; Ultrasound in Med. & Biol.; vol. 31(12); pp. 1673-1682; Dec. 2005.

Xu et al.; Optical and acoustic monitoring of bubble cloud dynamics at a tissue-fluid interface in ultrasound tissue erosion; Journal of the Acoustical Society of America; vol. 121(4); pp. 2421-2430; Apr. 2007.

Cain et al.; U.S. Appl. No. 13/648,955 entitled "Pulsed Cavitational Therapeutic Ultrasound With Dithering," filed Oct. 10, 2012.

Cain et al.; U.S. Appl. No. 13/648,965 entitled "Imaging Feedback of Histotripsy Treatments with Ultrasound Transient Elastography," filed Oct. 10, 2012.

Appel et al.; Stereoscopic highspeed recording of bubble filaments; Ultrasonics Sonochemistry; vol. 11(1); pp. 39-42; Jan. 2004.

Atchley et al.; Thresholds for cavitation produced in water by pulsed ultrasound; Ultrasonics.; vol. 26(5); pp. 280-285; Sep. 1988.

Bland et al.; Surgical Oncology; McGraw Hill; Chap. 5 (Cavitron Ultrasonic Aspirator); pp. 461-462; Jan. 29, 2001.

Burdin et al.; Implementation of the laser diffraction technique for cavitation bubble investigations; Particle & Particle Systems Characterization; vol. 19; pp. 73-83; May 2002.

Holland et al.; Thresholds for transient cavitation produced by pulsed ultrasound in a controlled nuclei environment; J. Acoust. Soc. Am.; vol. 88(5); pp. 2059-2069; Nov. 1990.

Huber et al.; Influence of shock wave pressure amplitude and pulse repetition frequency on the lifespan, size and number of transient cavities in the field of an electromagnetic lithotripter; Physics in Medicine and Biology; vol. 43 (10); pp. 3113-3128; Oct 1998.

Lauterborn et al.; Cavitation bubble dynamics studied by high speed photography and holography: part one; Ultrasonics; vol. 23; pp. 260-268; Nov. 1985.

Miller et al.; A review of in vitro bioeffects of inertial ultrasonic cavitation from a mechanistic perspective; Ultrasound in Medicine and Biology; vol. 22; pp. 1131-1154; (year of publication is sufficiently earlier than the effective U.S. filed and any foreign priority date) 1996.

Ohl et al.; Bubble dynamics, shock waves and sonoluminescence; Phil. Trans. R. Soc. Lond. A; vol. 357; pp. 269-294; (year of publication is sufficiently earlier than the effective U.S. filed and any foreign priority date) 1999.

Pishchalnikov et al.; Cavitation Bubble Cluster Activity in the Breakage of Kidney Stones by Lithotripter Shock Waves; J Endourol.; 17(7): 435-446; Sep. 2003.

Porter et al.; Reduction in left ventricular cavitary attenuation and improvement in posterior myocardial contrast . . . ; J Am Soc Echocardiography; pp. 437-441; Jul.-Aug. 1996.

Roy et al.; A precise technique for the measurement of acoustic cavitation thresholds and some preliminary results; Journal of the Acoustical Society of America; vol. 78(5); pp. 1799-805; Nov. 1985.

Sapozhnikov et al.; Ultrasound-Guided Localized Detection of Cavitation During Lithotripsy in Pig Kidney in Vivo; IEEE Ultrasonics Symposium, vol. 2; pp. 1347-1350; Oct. 7-10, 2001.

Sokolov et al.; Use of a dual-pulse lithotripter to generate a localized and intensified cavitation field; Journal of the Acoustical Society of America; vol. 110(3); pp. 1685-1695; Sep. 2001.

(56) References Cited

OTHER PUBLICATIONS

Cain, Charles A.; U.S. Appl. No. 13/570,708 entitled "Lesion Generation Through Bone Using Histotripsy Therapy Without Aberration Correction," filed Aug. 9, 2012.
Avago Technologies; ACNV2601 High Insulation Voltage 10 MBd Digital Optcoupler. Avago Technologies Data Sheet; pp. 1-11; Jul. 29, 2010.
Canney et al.; Shock-Induced Heating and Millisecond Boiling in Gels and Tissue Due to High Intensity Focused Ultrasound; Ultrasound in Medicine & Biology, vol. 36, pp. 250-267; Feb. 2010 (author manuscript).
Chan et al.; An image-guided high intensity focused ultrasound device for uterine fibroids treatment; Medical Physics, vol. 29, pp. 2611-2620, Nov. 2002.
Clement et al.; A hemisphere array for non-invasive ultrasound brain therapy and surgery; Physics in Medicine and Biology, vol. 45, p. 3707-3719, Dec. 2000.
Desilets et al.; The Design of Efficient Broad-Band Piezoelectric Transducers; Sonics and Ultrasonics, IEEE Transactions on, vol. 25, pp. 115-125, May 1978.
Giannatsis et al.; Additive fabrication technologies applied to medicine and health care: a review; The International Journal of Advanced Manufacturing Technology; 40(1-2); pp. 116-127; Jan. 2009.
Gudra et al.; Influence of acoustic impedance of multilayer acoustic systems on the transfer function of ultrasonic airborne transducers; Ultrasonics, vol. 40, pp. 457-463, May 2002.
Hall et al.; A Low Cost Compact 512 Channel Therapeutic Ultrasound System for Transcutaneous Ultrasound Surgery; AIP Conference Proceedings, Boston, MA; vol. 829, pp. 445-449, Oct. 27-29, 2005.
Hall et al.; Acoustic Access to the Prostate for Extracorporeal Ultrasound Ablation; Journal of Endourology, vol. 24, pp. 1875-1881, Nov. 2010.
Hartmann; Ultrasonic properties of poly(4-methyl pentene-1), Journal of Applied Physics, vol. 51, pp. 310-314, Jan. 1980.
Kim et al.; Dependence of particle volume fraction on sound velocity and attenuation of EPDM composites; Ultrasonics, vol. 46, pp. 177-183, Feb. 2007.
Krimholtz et al.; New equivalent circuits for elementary piezoelectric transducers; Electronics Letters, vol. 6, pp. 398-399, Jun. 1970.
Lensing et al.; Deep-vein thrombosis; The Lancet, vol. 353, pp. 479-485, Feb. 6, 1999.
Manes et al.; Design of a Simplified Delay System for Ultrasound Phased Array Imaging; Sonics and Ultrasonics, IEEE Transactions on, vol. 30, pp. 350-354, Nov. 1983.
Maréchal et al; Effect of Radial Displacement of Lens on Response of Focused Ultrasonic Transducer; Japanese Journal of Applied Physics, vol. 46, p. 3077-3085; May 15, 2007.
Maréchal et al; Lens-focused transducer modeling using an extended KLM model; Ultrasonics, vol. 46, pp. 155-167, May 2007.
Martin et al.; Water-cooled, high-intensity ultrasound surgical applicators with frequency tracking; Ultrasonics, Ferroelectrics and Frequency Control, IEEE Transactions on, vol. 50, pp. 1305-1317, Oct. 2003.
Maxwell et al.; Noninvasive Thrombolysis Using Pulsed Ultrasound Cavitation Therapy—Histotripsy; Ultrasound in Medicine & Biology, vol. 35, pp. 1982-1994, Dec. 2009 (author manuscript).
Parsons et al.; Cost-effective assembly of a basic fiber-optic hydrophone for measurement of high-amplitude therapeutic ultrasound fields; The Journal of the Acoustical Society of America, vol. 119, pp. 1432-1440, Mar. 2006.
Rosenschein et al.; Ultrasound Imaging-Guided Noninvasive Ultrasound Thrombolysis: Preclinical Results; Circulation; vol. 102; pp. 238-245, Jul. 11, 2000.
Sato et al.; Experimental Investigation of Phased Array Using Tapered Matching Layers. 2002 IEEE Ultrasound Symposium. vol. 2; pp. 1235-1238, Oct. 2002.
Simonin et al.; Characterization of heterogeneous structure in a polymer object manufactured by stereolithography with low-frequency microechography; Journal of Materials Chemistry; vol. 6, pp. 1595-1599, Sep. 1996.
Song et al.; Feasibility of Using Lateral Mode Coupling Method for a Large Scale Ultrasound Phased Array for Noninvasive Transcranial Therapy; Biomedical Engineering; IEEE Transactions on, vol. 57, pp. 124-133; Jan. 2010 (author manuscript).
Souquet et al.; Design of Low-Loss Wide-Band Ultrasonic Transducers for Noninvasive Medical Application; Sonics and Ultrasonics, IEEE Transactions on, vol. 26, pp. 75-80, Mar. 1979.
Toda; Narrowband impedance matching layer for high efficiency thickness mode ultrasonic transducers; Ultrasonics, Ferroelectrics and Frequency Control, IEEE Transactions on, vol. 49, pp. 299-306, Mar. 2002.
Van Kervel et al.; A calculation scheme for the optimum design of ultrasonic transducers; Ultrasonics, vol. 21, pp. 134-140, May 1983.
Wang et al.; Quantitative ultrasound backscatter for pulsed cavitational ultrasound therapy-histotripsy; Ultrasonics, Ferroelectrics and Frequency Control, IEEE Transactions on, vol. 56, pp. 995-1005, May 2009 (author manuscript).
Yan et al.; A review of rapid prototyping technologies and systems; Computer-Aided Design, vol. 28, pp. 307-318, Apr. 1996.
Akiyama et al.; Elliptically curved acoustic lens for emitting strongly focused finite-amplitude beams: Application of the spheroidal beam equation model to the theoretical prediction; Acoustical Science and Technology, vol. 26, pp. 279-284, May 2005.
Hall et al.; U.S. Appl. No. 13/874,083 entitled "Ultrasound Transducer Manufacturing Using Rapid-Prototyping Method," filed Apr. 30, 2013.
Cain et al.; U.S. Appl. No. 13/943,621 entitled "Devices and Methods for Using Controlled Bubble Cloud Cavitation in Fractionating Urinary Stones," filed Jul. 16, 2013.
Teofilovic et al.; U.S. Appl. No. 14/024,394 entitled "Histotripsy Therapy System," filed Sep. 11, 2013.
Avtech; AVR-8 Data sheet; May 23, 2004; 3 pages; retrieved from the internet (http//www.avtechpulse.com).
Cannata et al.; U.S. Appl. No. 14/323,693 entitled "Histotripsy excitation sequences optimized for bubble cloud formation using shock scattering," filed Jul. 3, 2014.

* cited by examiner

SYSTEMS AND METHODS FOR OBTAINING LARGE CREEPAGE ISOLATION ON PRINTED CIRCUIT BOARDS

INCORPORATION BY REFERENCE

All publications and patent applications mentioned in this specification are herein incorporated by reference to the same extent as if each individual publication or patent application was specifically and individually indicated to be incorporated by reference.

FIELD

The present disclosure relates generally to powering medical devices. More specifically, the present disclosure relates to obtaining sufficient creepage insulation distances required for high voltage medical devices.

BACKGROUND

Medical devices having electrical components typically must meet various electrical safety standards imposed by governing bodies (for example, in the United States, medical electrical equipment must satisfy the general standard IEC 60601-1 published by the International Electrotechnical Commission). One of the major concerns in electrical devices is electrical isolation. In applications where high voltages are used in close proximity to a patient, it can be very challenging to achieve the proper level of electrical isolation, since as the voltage used increases, the creepage distance and air clearance required must also be increased.

Generally, opto-isolators are used to transfer a signal over an isolation barrier, and DC to DC converters or transformers are used to transfer power over the isolation barriers. Opto-isolators currently on the market are capable of obtaining creepage insulation up to approximately 7 mm. However, in very high voltage devices, these opto-isolators are not capable of achieving the creepage insulation required by IEC 60601-1.

FIG. 1 illustrates an electrical circuit system 100 including a true ground circuit 102 and a single isolated circuit 104. In FIG. 1, the two circuits 102 and 104 are separated by a creepage insulation distance D. Power can be transmitted between the two circuits with, for example, an isolated DC to DC converter, and the input/output signals can be transmitted between the circuits with opto-isolators 108 and 110. As known in the art, opto-isolators are electronic devices configured to transfer electrical signals via light waves (e.g., from a light-emitting diode (LED) to a photosensor (such as a phototransistor or photoresistor). In the illustrative schematic shown in FIG. 1, traditional opto-isolators are typically capable of providing creepage isolation distances D up to ~7 mm.

Thus, methods and systems are required for high voltage medical devices to obtain creepage isolation of at least 12 mm-14 mm.

SUMMARY OF THE DISCLOSURE

In one embodiment, an electrical circuit is provided, comprising a ground circuit, a floating circuit optically coupled to the ground circuit, the floating circuit being electrically isolated from the ground circuit by a first creepage isolation distance, and an isolated circuit optically coupled to the floating circuit, the isolated circuit being electrically isolated from the floating circuit by a second creepage isolation distance, the isolated circuit being electrically isolated from the ground circuit by a total creepage isolation distance equal to a combination of the first and second creepage isolation distances.

In some embodiments, the total creepage isolation distance is at least twice as large as the first creepage isolation distance.

In other embodiments, the circuit further comprises a first opto-isolator configured to optically couple a signal input from the ground circuit to the floating circuit. In another embodiment, the circuit further comprises a second opto-isolator configured to optically couple the signal input from the floating circuit to the isolated circuit.

In one embodiment, the first opto-isolator comprises a diode disposed on the ground circuit and a transistor disposed on the floating circuit. In another embodiment, the second opto-isolator comprises a diode disposed on the floating circuit and a transistor disposed on the isolated circuit.

In some embodiments, the circuit further comprises a first opto-isolator configured to optically couple a signal input from the isolated circuit to the floating circuit. In one embodiment, the circuit further comprises a second opto-isolator configured to optically couple the signal input from the floating circuit to the ground circuit.

In one embodiment, the first opto-isolator comprises a diode disposed on the isolated circuit and a transistor disposed on the floating circuit. In another embodiment, the second opto-isolator comprises a diode disposed on the floating circuit and a transistor disposed on the ground circuit.

In some embodiments, the first creepage isolation distance is approximately 7 mm. In another embodiment, the second creepage isolation distance is approximately 7 mm and the total creepage isolation distance is approximately 14 mm.

In one embodiment, the ground circuit, floating circuit, and double isolated circuit are disposed on a printed circuit board.

An electrical circuit is provided, comprising, a ground circuit, a first floating circuit optically coupled to the ground circuit, the first floating circuit being electrically isolated from the ground circuit by a first creepage isolation distance, a second floating circuit optically coupled to the first floating circuit, the second floating circuit being electrically isolated from the first floating circuit by a second creepage isolation distance, and a triple isolated circuit optically coupled to the second floating circuit, the triple isolated circuit being electrically isolated from the second floating ground circuit by third creepage isolation distance, the triple isolated circuit being isolated from the ground circuit by a total creepage isolation distance equal to a combination of the first, second, and third creepage isolation distance, In some embodiments, the total creepage isolation distance is at least three times as large as the first creepage isolation distance.

In one embodiment, the circuit further comprises a first opto-isolator configured to optically couple a signal input from the ground circuit to the first floating circuit. In another embodiment, the circuit further comprises a second opto-isolator configured to optically couple the signal input from the first floating circuit to the second floating circuit. In an additional embodiment, the circuit further comprises a third opto-isolator configured to optically couple the signal input from the second floating circuit to the triple isolated circuit.

In some embodiments, the first opto-isolator comprises a diode disposed on the ground circuit and a transistor disposed on the first floating circuit. In another embodiment, the second opto-isolator comprises a diode disposed on the first floating circuit and a transistor disposed on the second floating circuit. In an additional embodiment, the third opto-isolator comprises a diode disposed on the second floating circuit and a transistor disposed on the triple isolated circuit.

A method of increasing a creepage isolation distance in an electrical circuit is also provided, comprising optically coupling a ground circuit to a floating circuit to electrically isolate the floating circuit from the ground circuit by a first creepage isolation distance, and optically coupling an isolated circuit to the floating circuit to electrically isolate the isolated circuit from the floating circuit by a second creepage isolation distance, and to electrically isolate the isolated circuit from the ground circuit by a total creepage isolation distance equal to a combination of the first and second creepage isolation distances.

In some embodiments of the method, optically coupling comprises optically coupling with an opto-isolator. In another embodiment, the total creepage isolation distance is approximately 14 mm.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

DETAILED DESCRIPTION

The present disclosure describes and illustrates effective and inexpensive methods and systems for obtaining a wide range of creepage isolation distances. These methods and systems are particularly well suited for high-voltage medical device applications where large creepage isolation distances are required by law or statute.

Figure 1:
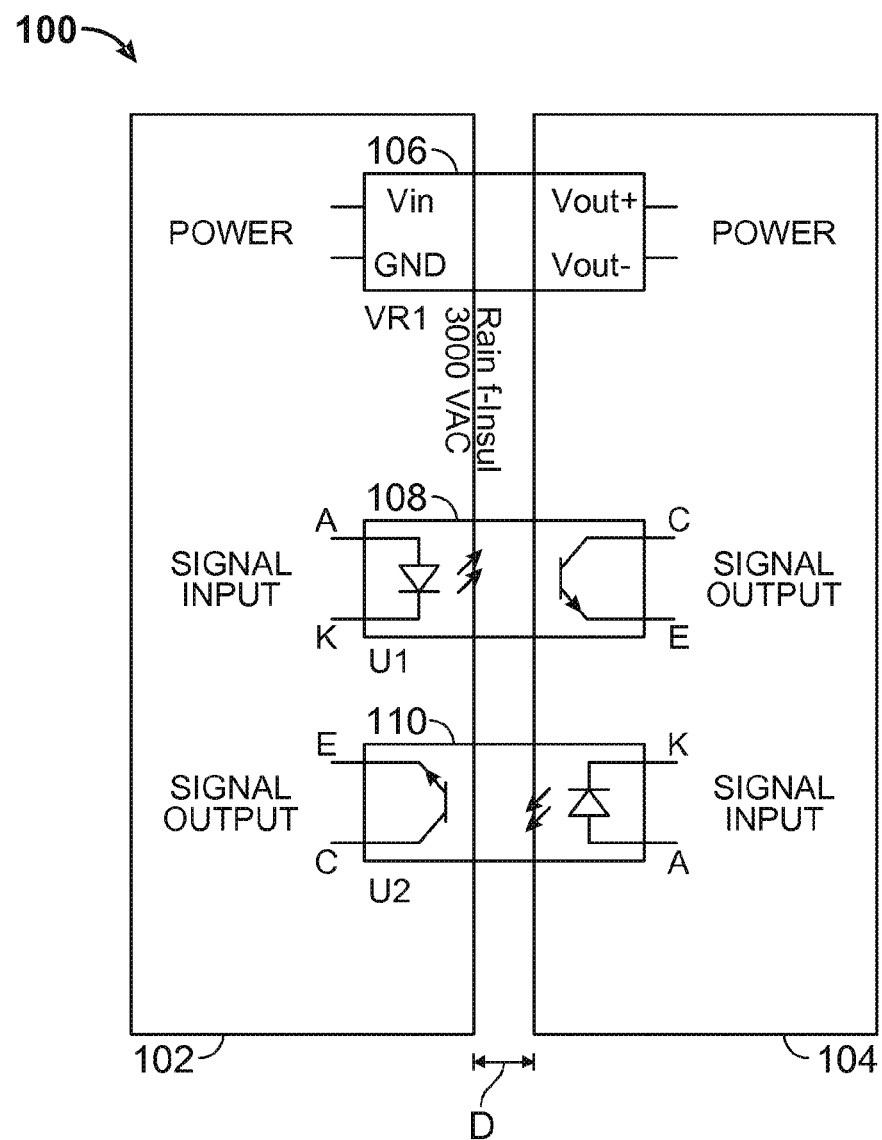
FIG. 1 illustrates an electrical circuit having a ground circuit and a single isolated circuit.
Figure 2:
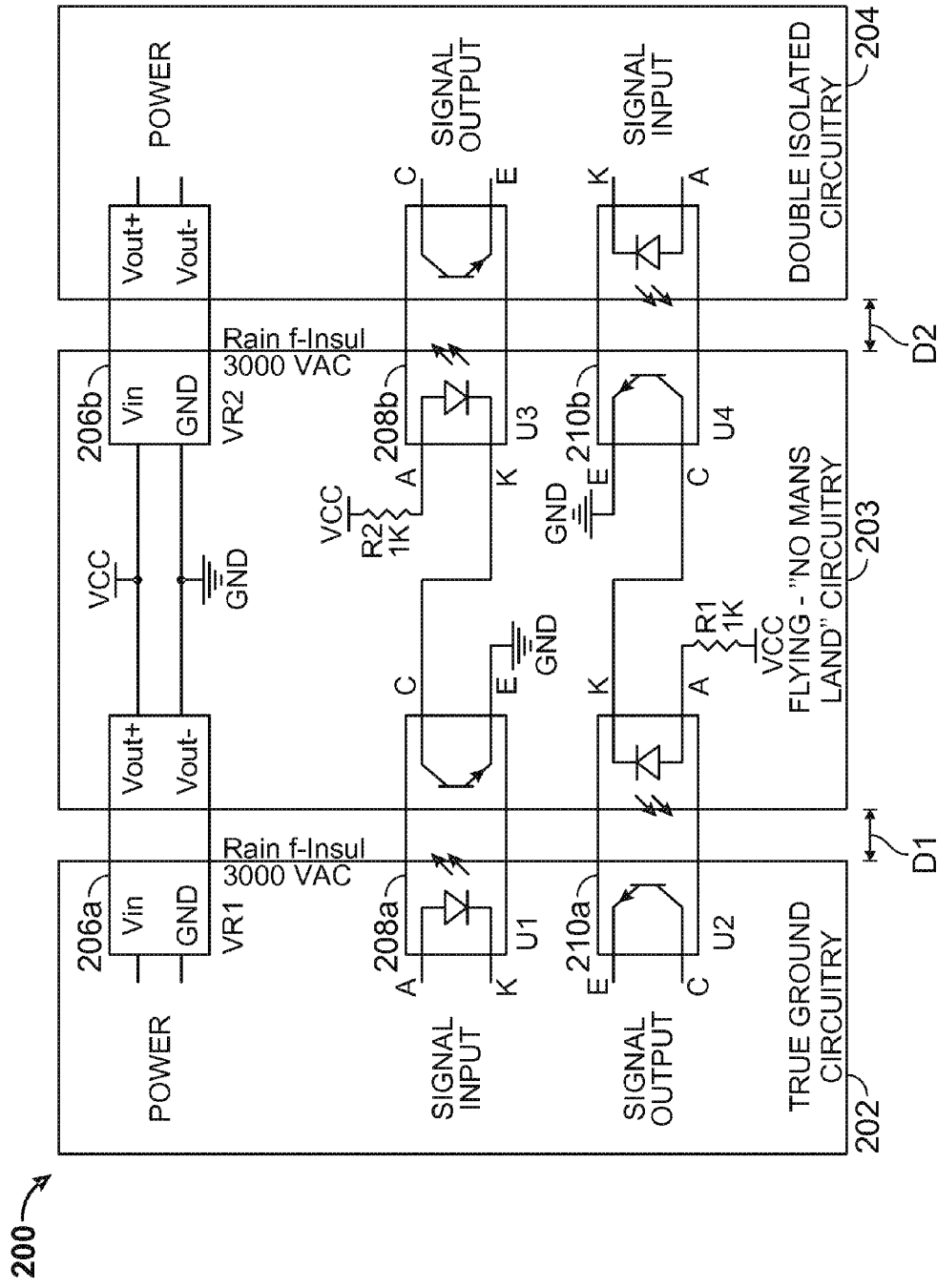
FIG. 2 illustrates an electrical circuit having a ground circuit, a floating circuit, and a double isolated circuit.

FIG. 2 illustrates a schematic electrical diagram of one embodiment of an electrical circuit 200 configured to provide large (e.g., up to 14 mm) creepage isolation distances. The electrical circuit can be disposed on, for example, a printed circuit board. As shown in FIG. 2, circuit 200 can include ground circuit 202, floating circuit 203, and double isolated circuit 204. Power can be transmitted from the ground circuit 202 to the double isolated circuit 204 via a pair of isolated DC to DC converters 206a and 206b. The input/output signals can be transmitted from the ground circuit 202 to the double isolated circuit 204 via opto-isolators 208a and 208b (signal input) and opto-isolators 210a and 210b (signal output).

Ground circuit 202 can be in optical/electrical communication with floating circuit 203, and floating circuit 203 can be in optical/electrical communication with double isolated circuit 204. The opto-isolators used for coupling the circuits can be electronic devices configured to transfer electrical signals via light waves (e.g., from a light-emitting diode (LED) to a photosensor (such as a phototransistor or photoresistor).

Opto-isolators typically have an LED as an input and various components at the output (e.g., mosfet, IGBT, logic gate, triac, Darlington, etc).

As shown in FIG. 2, opto-isolator 208a can comprise a diode in ground circuit 202 optically coupled to a transistor in floating circuit 203 for communicating signal inputs from the ground circuit to the floating circuit. Similarly, opto-isolator 210a can comprise a diode in floating circuit 203 optically coupled to a transistor in ground circuit 202 for communicating signal outputs from the floating circuit to the ground circuit. A similar configuration can communicate signal inputs and outputs from the floating circuit to the double isolated circuit, namely, opto-isolator 208b comprising a diode in the floating circuit optically coupled to a transistor in the double isolated circuit, and opto-isolator 210b comprising a diode in the double isolated circuit optically coupled to a transistor in the floating circuit.

In one embodiment, the electrical circuit of FIG. 2 comprises a ground circuit 202, a floating circuit 203 optically coupled to the ground circuit via opto-isolators 208a and 210a, the floating circuit being electrically isolated from the ground circuit by a first creepage isolation distance D1, and an isolated circuit optically coupled to the floating circuit via opto-isolators 208b and 210b, the isolated circuit being electrically isolated from the floating circuit by a second creepage isolation distance, the isolated circuit being electrically isolated from the ground circuit by a total creepage isolation distance equal to a combination of the first and second creepage isolation distances.

The electrical circuit 200 of FIG. 2 can be configured to optically couple a signal input from the ground circuit to the floating circuit, and to optically couple the signal input from the floating circuit to the isolated circuit. Similarly, the electrical circuit of FIG. 2 can be configured to optically couple a signal input from the isolated circuit to the floating circuit, and to optically couple the signal input from the floating circuit to the ground circuit.

The floating circuit is isolated from the ground and isolated circuits because there is no physical point of contact between the floating circuit and either the ground or isolated circuits. Instead, the floating circuit is optically coupled to both the ground and isolated circuits. The values of the resistors in the floating circuit are calculated using ohms law and depend on the LED forward current, LED voltage drop, and VCC voltage. In some embodiments, very fast opto-isolators with logic output can be used to keep delays less than 10 ns.

In FIG. 2, the addition of floating circuit 203 between ground circuit 202 and double isolated circuit 204 allows system 200 to essentially double the creepage isolation distances obtainable with a single conventional opto-isolator. In FIG. 2, the creepage isolation distance effectively becomes D1+D2, or 2×D. Since conventional opto-isolators are capable of approximately ~7 mm of creepage isolation, the system of FIG. 2 is capable of providing up to approximately ~14 mm of creepage isolation. It should be understood that if opto-isolators are capable of providing more than the ~7 mm of creepage isolation, the circuit systems described herein would still be capable of providing double the creepage isolation distances obtainable with a single opto-isolator.

Figure 3:
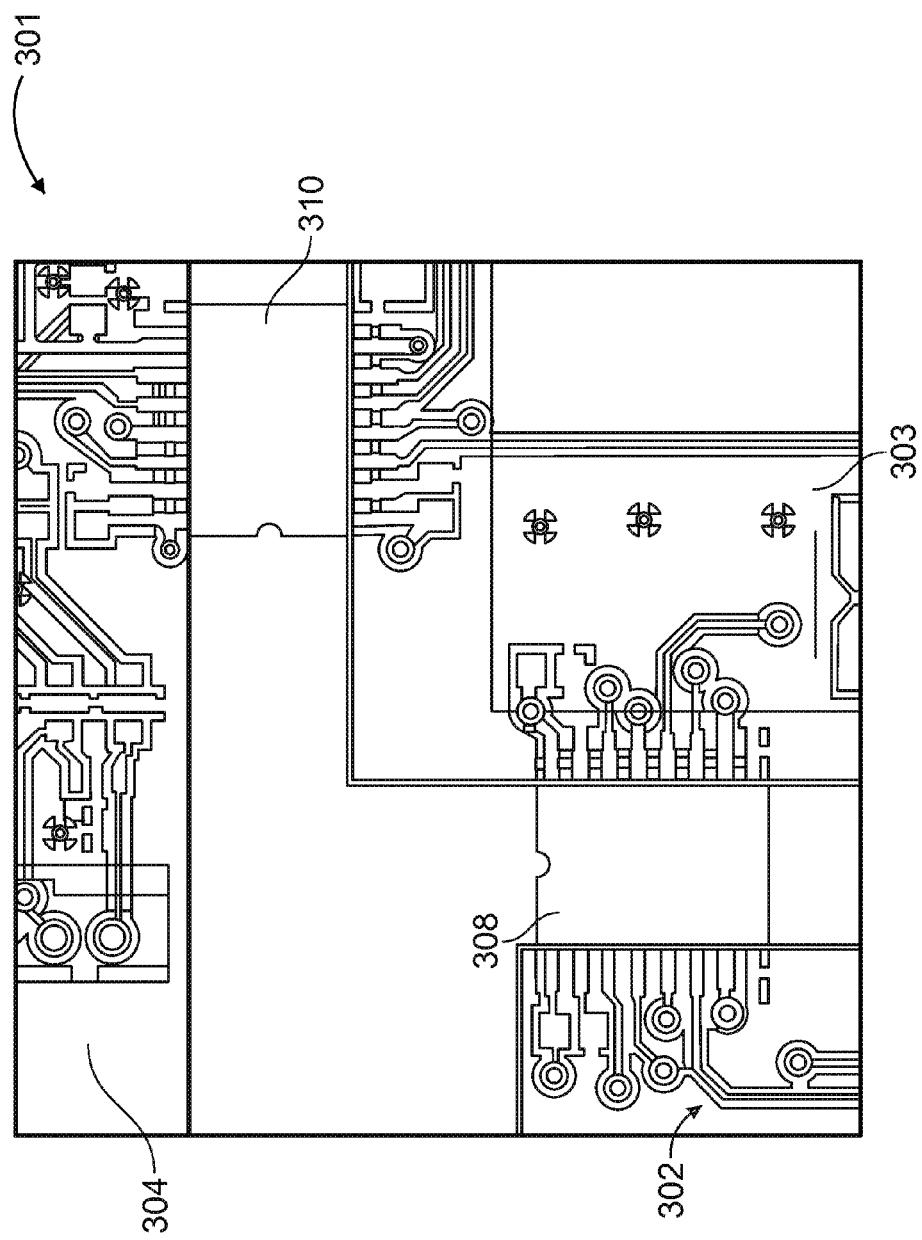
FIG. 3 is a schematic drawing of one embodiment of a printed circuit board layout including the circuits described above in FIG. 2.

FIG. 3 is a schematic drawing of one embodiment of a printed circuit board layout including the circuits described above in FIG. 2. In FIG. 3, printed circuit board 301 can include ground circuit 302, floating circuit 303, and double isolated circuit 304. Ground circuit 302 can be electrically isolated from floating circuit 303 via opto-isolator 308. Similarly, double isolated circuit 304 can be electrically isolated from floating circuit 303 via opto-isolator 310. As shown in the diagram, this embodiment provides a creepage isolation distance of 7.24 mm+7.43 mm for a total of approximately 14.73 mm of isolation.

Figure 4:
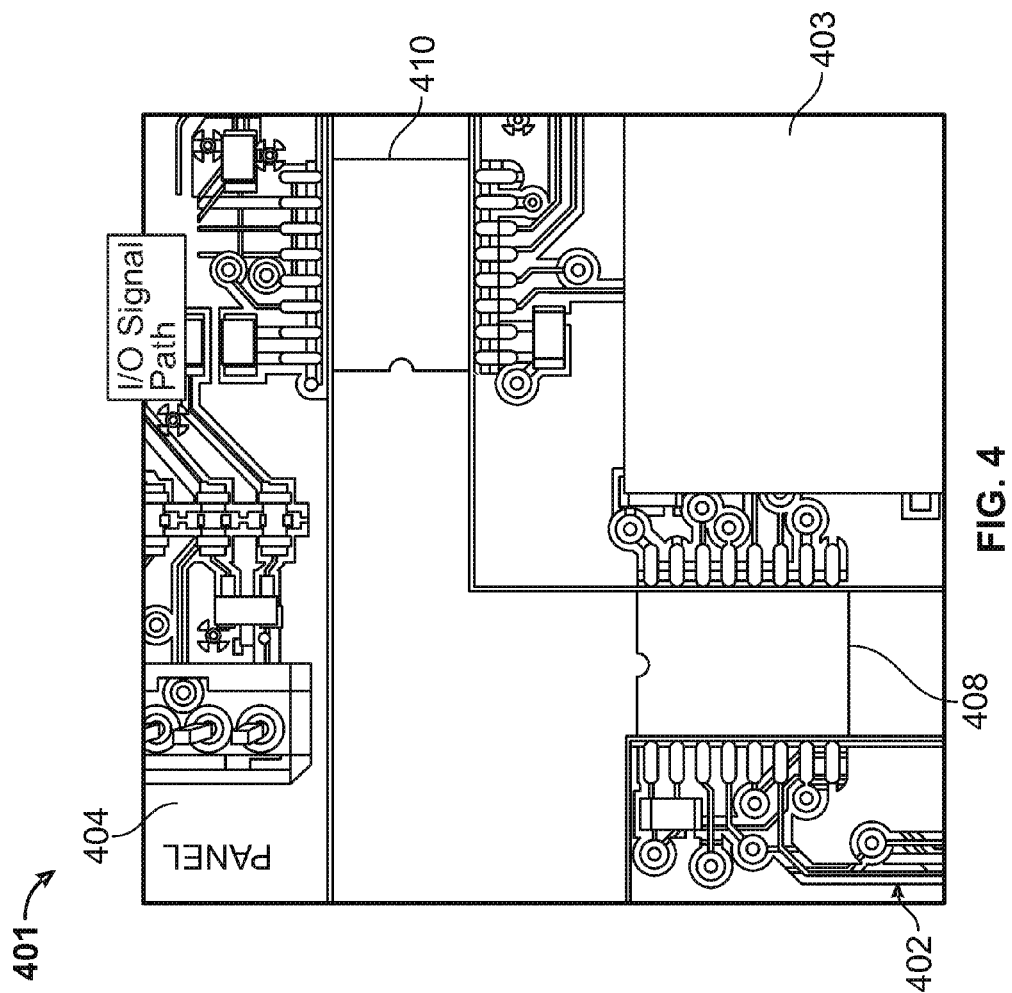
FIG. 4 illustrates a 3D view of the printed circuit board of FIG. 3.

FIG. 4 illustrates a 3D view of the printed circuit board of FIG. 3. Printed circuit board 401 includes all of the same features of the PCB layout of FIG. 3, including ground circuit 402, floating circuit 403, and double isolated circuit 404, and opto-isolators 408 and 410. PCB 401 also illustrates the input/output signal path from ground circuit 402, through floating circuit 403, to double isolated circuit 404 and back. During a PCB layout process, it is important that the creepage requirements are met throughout the entire PCB. The circuits shown in FIGS. 3 and 4 satisfy the requirement of having a minimum of ~14 mm of creepage distance throughout the entire PCB.

Figure 5:
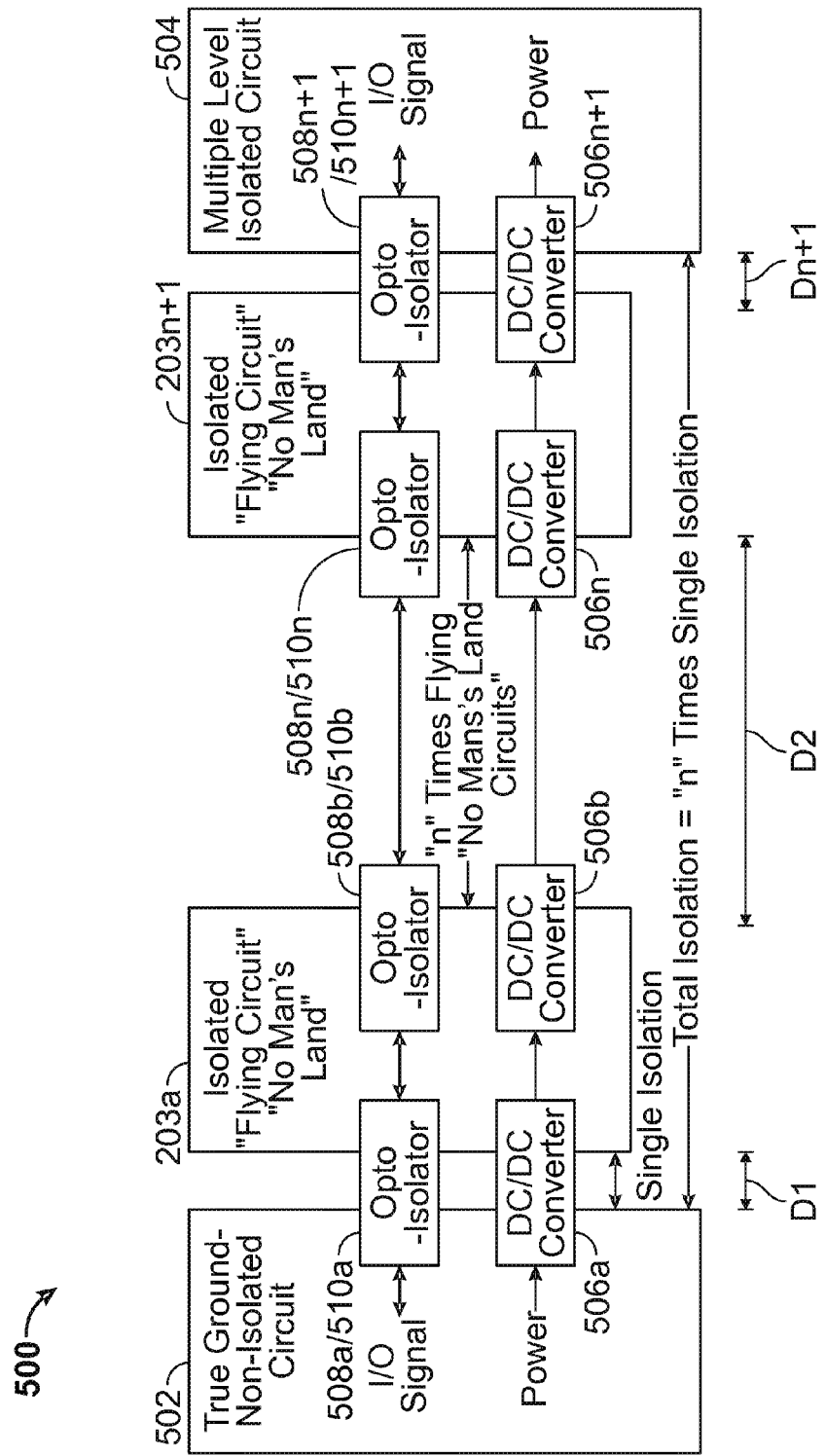
FIG. 5 illustrates one embodiment which can provide an isolation creepage distance of n times a single isolation distance (e.g. n times 7 mm of creepage distance for conventional opto-isolators).

The embodiments described above can be further applied to providing even larger isolation creepage distances by using multiple floating circuits. FIG. 5 illustrates one embodiment which can provide an isolation creepage distance of n times a single isolation distance (e.g. n times 7 mm of creepage distance for conventional opto-isolators). In FIG. 5, multiple floating circuits are disposed between the ground circuit 502 and the isolated circuit 504. The amount of creepage distance desired determines the number of floating circuits used. For example, to achieve approximately 21 mm of creepage distance with a conventional opto-insulator, a total of two floating circuits can be used between the ground and isolated circuits. The input/output signals can be optically transmitted from the ground circuit, through the floating circuits, to the isolated circuit, via opto-insulators 508a/510a through 508n+1/510n+1. Similarly, n+1 DC/DC converters can transfer power from the ground circuit, through the floating circuits, to the isolated circuit. This configuration provides for a total isolation creepage distance of n times the amount of isolation provided by a single opto-insulator. For example, assuming an opto-isolator capable of providing 7 mm of isolation, two floating circuits would provide ~21 mm of isolation, three floating circuits would provide ~28 mm of isolation, and so forth.

Referring to FIG. 5, an electrical circuit with two floating circuits (and a total of ~21 mm of isolation with conventional opto-isolators) can be described. In this embodiment, the electrical circuit of FIG. 5 comprises a ground circuit 502, a first floating circuit 203a optically coupled to the ground circuit via opto-isolators 508a and 510a, the floating circuit being electrically isolated from the ground circuit by a first creepage isolation distance D1, a second floating circuit 203n+1 optically coupled to the first floating circuit via opto-isolators 508b and 510b, the second floating circuit being electrically isolated from the ground circuit by a first creepage isolation distance D1 and a second creepage isolation distance D2, the electrical circuit further comprising an isolated circuit optically coupled to the second floating circuit via opto-isolators 508n+1 and 510n+1, the isolated circuit being electrically isolated from the floating circuit by a third creepage isolation distance, the isolated circuit being electrically isolated from the ground circuit by a total creepage isolation distance equal to a combination of the first, second, and third creepage isolation distances.

In this example, the circuit can be configured to optically couple a signal input from the ground circuit to the first floating circuit, to optically couple the signal input from the first floating circuit to the second floating circuit, and to optically couple the signal input from the second floating circuit to the isolated circuit. Similarly, the electrical circuit of FIG. 5 can be configured to optically couple a signal input from the isolated circuit to the second floating circuit, to optically couple the signal input from the second floating circuit to the first floating circuit, and to optically couple the signal input from the first floating circuit to the ground circuit As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. An electrical circuit, comprising:
   a ground circuit;
   a floating circuit optically coupled to the ground circuit with a first opto-isolator, the floating circuit being electrically isolated from the ground circuit by a first creepage isolation distance; and
   an isolated circuit optically coupled to the floating circuit with a second opto-isolator, the isolated circuit being electrically isolated from the floating circuit by a second creepage isolation distance, the first opto-isolator being electrically connected to the second opto-isolator in series so that the isolated circuit is electrically isolated from the ground circuit by a total creepage isolation distance equal to a combination of the first and second creepage isolation distances.

2. The electrical circuit of claim 1 wherein the total creepage isolation distance is at least twice as large as the first creepage isolation distance.

3. The electrical circuit of claim 1 wherein the first opto-isolator is configured to optically couple a signal input from the ground circuit to the floating circuit.

4. The electrical circuit of claim 3 wherein the second opto-isolator is configured to optically couple the signal input from the floating circuit to the isolated circuit.

5. The electrical circuit of claim 3 wherein the first opto-isolator comprises a diode disposed on the ground circuit and a transistor disposed on the floating circuit.

6. The electrical circuit of claim 4 wherein the second opto-isolator comprises a diode disposed on the floating circuit and a transistor disposed on the isolated circuit.

7. The electrical circuit of claim 1 wherein the first opto-isolator is configured to optically couple a signal input from the isolated circuit to the floating circuit.

8. The electrical circuit of claim 7 wherein the second opto-isolator is configured to optically couple the signal input from the floating circuit to the ground circuit.

9. The electrical circuit of claim 7 wherein the first opto-isolator comprises a diode disposed on the isolated circuit and a transistor disposed on the floating circuit.

10. The electrical circuit of claim 8 wherein the second opto-isolator comprises a diode disposed on the floating circuit and a transistor disposed on the ground circuit.

11. The electrical circuit of claim 1 wherein the first creepage isolation distance is approximately 7 mm.

12. The electrical circuit of claim 1 wherein the second creepage isolation distance is approximately 7 mm and the total creepage isolation distance is approximately 14 mm.

13. The electrical circuit of claim 1 wherein the ground circuit, floating circuit, and double isolated circuit are disposed on a printed circuit board.

14. An electrical circuit, comprising:
    a ground circuit;
    a first floating circuit optically coupled to the ground circuit, the first floating circuit being electrically isolated from the ground circuit by a first creepage isolation distance;
    a second floating circuit optically coupled to the first floating circuit, the second floating circuit being electrically isolated from the first floating circuit by a second creepage isolation distance; and
    a triple isolated circuit optically coupled to the second floating circuit, the triple isolated circuit being electrically isolated from the second floating ground circuit by a third creepage isolation distance, the triple isolated circuit being isolated from the ground circuit by a total creepage isolation distance equal to a combination of the first, second, and third creepage isolation distances.

15. The electrical circuit of claim 14 wherein the total creepage isolation distance is at least three times as large as the first creepage isolation distance.

16. The electrical circuit of claim 14 further comprising a first opto-isolator configured to optically couple a signal input from the ground circuit to the first floating circuit.

17. The electrical circuit of claim 16 further comprising a second opto-isolator configured to optically couple the signal input from the first floating circuit to the second floating circuit.

18. The electrical circuit of claim 17 further comprising a third opto-isolator configured to optically couple the signal input from the second floating circuit to the triple isolated circuit.

19. The electrical circuit of claim 16 wherein the first opto-isolator comprises a diode disposed on the ground circuit and a transistor disposed on the first floating circuit.

20. The electrical circuit of claim 17 wherein the second opto-isolator comprises a diode disposed on the first floating circuit and a transistor disposed on the second floating circuit.

21. The electrical circuit of claim 18 wherein the third opto-isolator comprises a diode disposed on the second floating circuit and a transistor disposed on the triple isolated circuit.

22. A method of increasing a creepage isolation distance in an electrical circuit, comprising:
    optically coupling a ground circuit to a floating circuit with a first opto-isolator to electrically isolate the floating circuit from the ground circuit by a first creepage isolation distance; and
    optically coupling an isolated circuit to the floating circuit with a second-opto isolator to electrically isolate the isolated circuit from the floating circuit by a second creepage isolation distance, and electrically connecting the first opto-isolator to the second opto-isolator in series to electrically isolate the isolated circuit from the ground circuit by a total creepage isolation distance equal to a combination of the first and second creepage isolation distances.

23. The method of claim 22 wherein the total creepage isolation distance is approximately 14 mm.

24. An electrical circuit, comprising:
    a ground circuit;
    a floating circuit optically coupled to the ground circuit, the floating circuit being electrically isolated from the ground circuit by a first creepage isolation distance; and
    an isolated circuit comprising a first opto-isolator configured to optically couple a signal input of the isolated circuit to the floating circuit, the first opto-isolator comprising a diode disposed on the isolated circuit and a transistor disposed on the floating circuit, the isolated circuit being electrically isolated from the floating circuit by a second creepage isolation distance, the isolated circuit being electrically isolated from the ground circuit by a total creepage isolation distance equal to a combination of the first and second creepage isolation distances.

* * * * *